(12) United States Patent
Okada

(10) Patent No.: US 6,249,169 B1
(45) Date of Patent: *Jun. 19, 2001

(54) TRANSISTOR OUTPUT CIRCUIT

(75) Inventor: Koji Okada, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,989

(22) Filed: Dec. 29, 1998

(30) Foreign Application Priority Data

Jun. 1, 1998 (JP) .................................. 10-151627

(51) Int. Cl.$^7$ ........................................ H03L 5/00
(52) U.S. Cl. ...................... 327/333; 327/387; 327/281
(58) Field of Search .................. 327/437, 442, 327/108, 374, 376, 377, 387, 333, 281

(56) References Cited

U.S. PATENT DOCUMENTS

| | | | |
|---|---|---|---|
| 5,012,141 | * 4/1991 | Tomisawa | 327/276 |
| 5,465,054 | 11/1995 | Erhart | 326/34 |
| 5,923,069 | * 7/1999 | Park et al. | 257/365 |
| 5,939,937 | * 8/1999 | Terletzki | 327/541 |

FOREIGN PATENT DOCUMENTS

| | | |
|---|---|---|
| 62-149218 | 7/1987 | (JP) . |
| 6-326591 | 11/1994 | (JP) . |
| 09-172368 | 6/1997 | (JP) . |
| 09-246945 | 9/1997 | (JP) . |

OTHER PUBLICATIONS

Patent Abstracts of Japan, vol. 1995, No. 6, (JP 07–074616 A), Jul. 31, 1995, 1 page.

* cited by examiner

*Primary Examiner*—Tuan T. Lam
*Assistant Examiner*—Hiep Nguyen
(74) *Attorney, Agent, or Firm*—Armstrong, Westerman, Hattori, McLeland & Naughton, LLP

(57) ABSTRACT

A transistor output circuit generates an output signal having a voltage greater than a breakdown voltage of the transistors used to construct the output circuit. The output circuit includes an NMOS transistor and a PMOS transistor that are connected in series and have their gates connected to each other. A potential control circuit is also connected to the gates and the sources of the NMOS and PMOS transistors. The potential control circuit receives power from a high potential power supply and a low potential power supply. The potential control circuit applies a reference voltage, which has a voltage value between the voltages generated by the high and low potential power supplies, to the gates of the transistors. Then, in response to an input signal, the potential control circuit controls the voltages applied to the sources of the transistors. The output circuit may be connected to a level converter circuit, an op amp circuit, and other logic circuits.

21 Claims, 7 Drawing Sheets

Fig.2
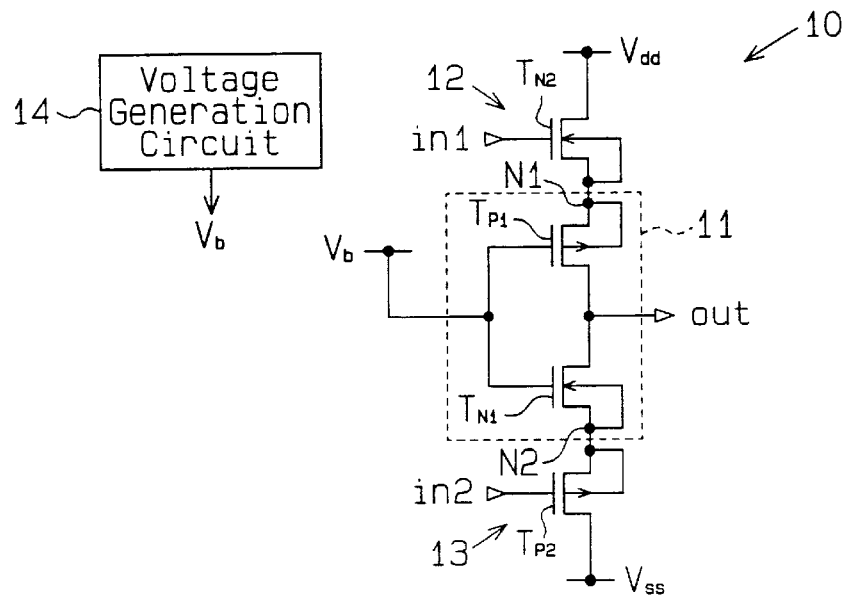
Fig.3A in1
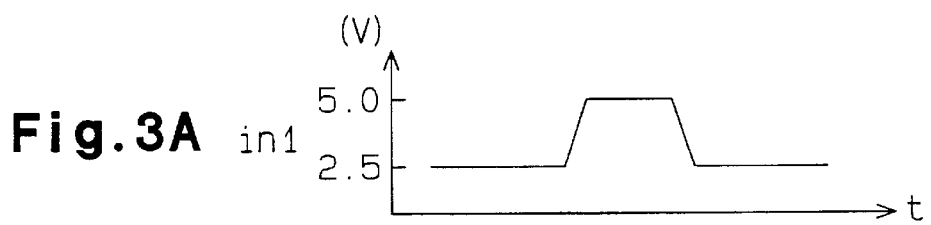
Fig.3B out
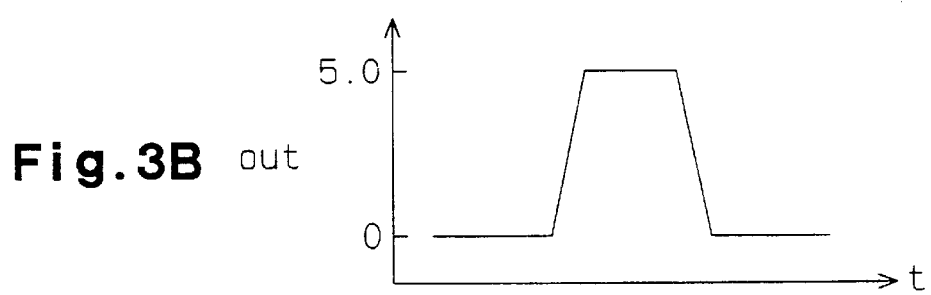
Fig.3C in2
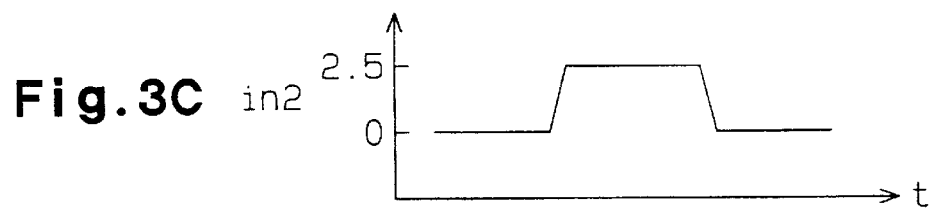

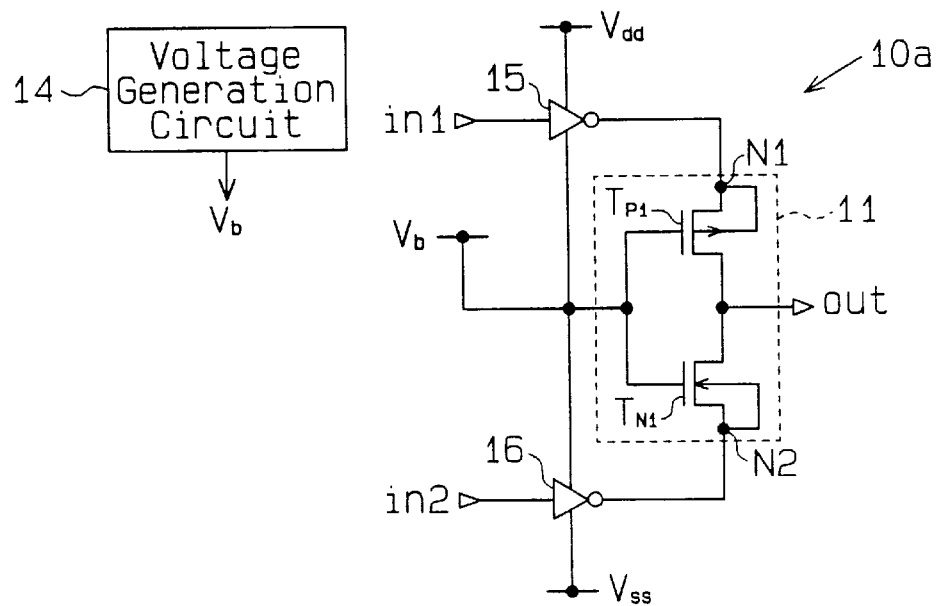

US 6,249,169 B1

TRANSISTOR OUTPUT CIRCUIT

BACKGROUND OF THE INVENTION

The present invention generally relates to an output circuit used in circuits such as a level converter circuit, logic circuit, and an operational amplifier circuit, and, more particularly, to an output circuit for outputting an output signal having an amplitude that exceeds the breakdown voltage of a transistor of the output circuit.

In the past, an output circuit equipped with a CMOS inverter circuit was driven by receiving power from a high potential power supply Vdd (for example, 5 volts) and a low potential power supply Vss (for example, 0 volts). An input signal is amplified in a full scale within the range of power supply Vdd or Vss levels. An inverse signal of the input signal is output from the output terminal of the inverter circuit.

Due to miniaturization of semiconductor integrated circuit devices in recent years, MOS transistors with a lower breakdown voltage than the power supply Vdd or Vss level are used. However, it is desirable to provide an output signal amplified in a full scale within the range of power supply Vdd or Vss level. Accordingly, the MOS transistor of the output circuit should have a breakdown voltage that exceeds the differential voltage between the power supplies Vdd and Vss. For this purpose, special MOS transistors with a high breakdown voltage are used for the output circuit. Specifically, the high breakdown voltage MOS transistor has a relatively thick gate insulating film formed by repeating a gate oxide film formation process during fabrication.

However, repeating the gate oxide formation process increases the dispersion of MOS transistor characteristics and raises the manufacturing costs of the devices. Moreover, because the MOS transistor with a thickly filmed gate insulating film has a relatively high threshold, it also has an increased on resistance. Consequently, the drive capacity of the transistor is decreased. In order to increase the drive capacity of the transistor, the size of the transistor can be increased. However, increasing the transistor size prevents high integration of semiconductor integration circuit devices.

It is an object of the present invention to provide an output circuit that outputs an output signal having an amplitude exceeding the breakdown voltage of the MOS transistors from which it is constructed.

SUMMARY OF THE INVENTION

In one aspect of the invention, an output circuit includes a PMOS transistor and an NMOS transistor connected in series. A potential control circuit is connected to the gate and source of the PMOS transistor and the NMOS transistor. The potential control circuit receives power from a high potential power supply and a low potential power supply, and controls the voltage applied to the gate and the source of the PMOS transistor and the NMOS transistor in response to an input signal having one of first level and a second level. The potential control circuit applies a reference voltage to the gates of the PMOS transistor and the NMOS transistor. The reference voltage is between the high potential power supply level and the low potential power supply voltage level. The potential control circuit applies the high potential power supply voltage to the source of the PMOS transistor in response to an input signal with the first level and applies a voltage to the source of the NMOS transistor to make the NMOS transistor nonconductive, so that an output signal with the high potential power supply voltage is output from a node between the PMOS transistor and NMOS transistor The potential control circuit applies the low potential power supply voltage to the source of the NMOS transistor in response to an input signal having the second level and apples a voltage to the source of the PMOS transistor to make the PMOS transistor nonconductive, so that an output signal having the low potential power supply voltage is output from the node between the PMOS transistor and NMOS transistor.

In another aspect of the invention, an output circuit includes a PMOS transistor and an NMOS transistor connected in series. A first source follower circuit is connected between the source of the PMOS transistor and a high potential power supply. The first source follower circuit selectively applies a high potential power supply voltage to the source of the PMOS transistor in response to a first input signal having a voltage that changes between the high potential power supply voltage and a reference voltage. The reference voltage is between the high potential power supply voltage and a low potential power supply voltage A second source follower circuit is connected between the source of the NMOS transistor and a low potential power supply. The second source follower circuit selectively applis the low potential power supply voltage to the source of the NMOS transistor in response to a second input signal having a voltage that changes between the reference voltage and low potential power supply voltage. An output terminal is located at a node between the PMOS transistor and the NMOS transistor. The output terminal outputs an output signal having one of the high potential power supply voltage and the low potential power supply voltage.

In yet another aspect of the invention, an output circuit includes a PMOS transistor and a NMOS transistor connected in series. A first inverter circuit is connected to the source of the PMOS transistor. The first inverter circuit receives power from a high potential power supply and a reference voltage between the high potential power supply voltage and a low potential power supply voltage. The first inverter receives a first input signal having a voltage that changes between the high potential power supply voltage and the reference voltage and apples one of the high potential power supply voltage and reference voltage to the source of the PMOS transistor. A second inverter circuit is connected to the source of the NMOS transistor. The second inverter circuit receives power from the reference voltage and a low potential power supply. The second inverter circuit receives a second input signal having a voltage that changes between the reference voltage and the low power supply voltage and applies one of the reference voltage and the low potential power supply voltage to the source of the NMOS transistor. An output terminal is located at a node between the PMOS transistor and the NMOS transistor. The output terminal outputs an output signal having one of the high potential power supply voltage and the low potential power supply voltage.

In one aspect of the invention, a level converter circuit includes an input signal converter for receiving power from a high potential power supply and a low potential power supply and converting an external input signal to first and second input signals. The first input signal has a voltage that changes between the high potential power supply voltage and a reference voltage. The reference voltage is between the high potential power supply voltage and the low potential power supply voltage. The second input signal has a voltage that changes between the reference voltage and the low potential power supply voltage. An output circuit is connected to the input signal converter. The output circuit receives the first and second input signals and outputs an output signal having one of the high potential power supply voltage and the low potential power supply voltage.

In another aspect of the invention, a logic circuit includes first and second power supplies for shifting voltages of first and second input signals, thereby generating first and second shifted input signals. An output circuit is connected to the first and second power supplies. The output circuit receives the first and second input signals and the first and second shifted input signals and outputs a predetermined logical signal. The output circuit includes a PMOS transistor and a NMOS transistor connected in series. A first NAND circuit is connected to the source of the PMOS transistor and receives power from the high potential power supply and a reference voltage. The reference voltage is between the high potential power supply voltage and the low potential voltage power supply. The first NAND circuit receives the first and second shifted input signals and applies one of the high potential power supply voltage and the reference voltage to the source of the PMOS transistor. A second NAND circuit is connected to the source of the NMOS transistor and receives power from the reference voltage and the low potential power supply. The second NAND circuit receives the first and second input signals and applies one of the reference voltage and the low potential power supply voltage to the source of the NMOS transistor. An output terminal is located at a node between the PMOS transistor and NMOS transistor and outputs a logical signal.

In yet another aspect of the invention, an operational amplifier includes an input circuit for receiving power from a high potential power supply and a low potential power supply and generating first and second voltage signals by comparing first and second input signals with each other. The first signal has one of the high potential power supply voltage and a reference voltage. The reference voltage is between the high potential power supply voltage and the low potential power supply voltage. The second voltage signal has one of the reference voltage and the low potential power supply voltage. An output circuit is connected to the input circuit. The output circuit receives the first and second voltage signals and outputs an output signal having one of the high potential power supply voltage and the low potential power supply voltage.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2 is a circuit diagram of the output circuit according to a first embodiment of the present invention;

FIGS. 3A to 3C are operating wavelength diagrams of the output circuit of FIG. 2;

FIG. 4 is a circuit diagram of the output circuit according to a second embodiment of the present invention;

FIG. 5 is a circuit diagram of a level converter circuit according to a third embodiment of the present invention;

DETAILED DESCRIPTION OF THE PREFERRED EMBODIMENTS

The present invention will now be described with reference to the drawings, wherein like numerals are used for like elements throughout.

Figure 1:
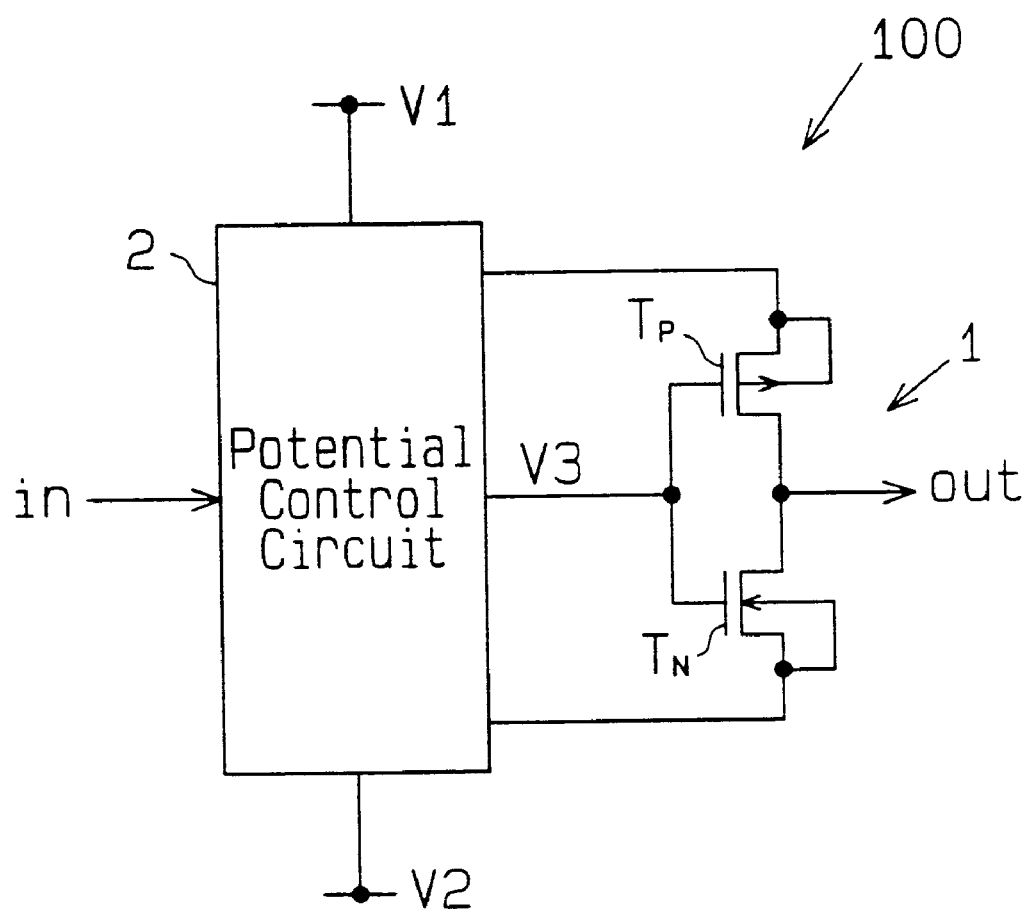
FIG. 1 is a schematic diagram of an output circuit of the present invention.

FIG. 1 is a circuit diagram of an output circuit 100 of the present invention. The output circuit 100 has a CMOS inverter circuit 1 and a potential control circuit 2. The output circuit 100 receives a binary input signal in and outputs an output signal out that changes between the levels of external power supplies V1 and V2. The inverter 1 includes a PMOS transistor TP and an NMOS transistor TN. The potential control circuit 2 supplies a reference voltage V3 to the gates of both of the transistors TP and TN. The reference voltage V3 has a predetermined level between a voltage lower than the level of the high potential power supply V1 only for the threshold of the PMOS transistor TP and a voltage higher than the level of the low potential power supply V2 only for the threshold of the NMOS transistor TN.

The potential control circuit 2 mutually synchronizes with and raises the source potential of both of the transistors TP and TN in response to the input signal having a first level, and sets the source potential of the PMOS transistor TP to the high potential power supply V1 level and the voltage between the gate and source of the NMOS transistor TN to a level lower than the threshold of the NMOS transistor TN. The potential control circuit 2 also synchronizes with and drops the source potential of both of the transistors TP and TN in response to the input signal having a second level, and sets the source voltage of the NMOS transistor TN to the low potential power supply V2 level and the voltage between the gate and source of the PMOS transistor TP to a level lower than the threshold of the PMOS transistor.

(First Embodiment)

FIG. 2 is a circuit diagram of an output circuit 10 according to a first embodiment of the present invention. The output circuit 10 includes a CMOS inverter circuit 11 equipped with a PMOS transistor TP1 and an NMOS transistor TN1, an NMOS transistor TN2 as a first source follower circuit 12, a PMOS transistor TP2 as a second source follower circuit 13, and a voltage generation circuit 14. The first and second source follower circuits 12 and 13 form a source potential control circuit. The first and second source follower circuits 12 and 13, and the voltage generation circuit 14 form a potential control circuit.

The voltage generation circuit 14 is preferably formed on the same semiconductor integrated circuit chip as the CMOS inverter circuit 11. The voltage generation circuit 14 supplies the intermediate voltage Vb, as a reference voltage, to the gates of both of the transistors TP1 and TN1 of the inverter circuit 11. The intermediate voltage Vb is a fixed voltage (for example, 2.5 volts) having an intermediate level for the high potential and low potential power supply supplies Vdd and Vss.

The PMOS transistor TP1 has a source (node N1) connected to the high potential power supply Vdd (for example, 5 volts) through the NMOS transistor TN2. The NMOS transistor TN1 has a source (node N2) connected to the low potential power supply Vss (for example, 0 volt) through the PMOS transistor TP2. The respective transistors TP1 and TN1 have a breakdown voltage of 2.5 volts.

The NMOS transistor TN2 has a gate receiving a first input signal in1, a source connected to the node N1, and a drain connected to the high potential power supply Vdd. The first input signal in1 changes between the intermediate voltage Vb level and the high potential power supply Vdd level as shown in FIG. 3A. When the first input signal in1 has the intermediate voltage Vb level, the source (i.e. node N1) of the NMOS transistor TN2 is set almost to the intermediate voltage Vb (Vb−Vth) level. When the first input signal in1 has the high potential power supply Vdd level, the node N1 is set almost to the high potential power supply Vdd (Vdd−Vth) level.

The PMOS transistor TP2 has a gate receiving a second input signal in2, a source connected to the node N2, and a drain connected to the low potential power supply Vss. The second input signal in2 changes between the low potential power supply Vss level and the intermediate voltage Vb level as shown in FIG. 3C. When the second input signal in2 has the low potential power supply Vss level, the source (i.e. node N2) of the PMOS transistor TP2 is set almost to the low potential power supply Vss (Vss+Vth) level. When the second input signal in2 has the intermediate voltage Vb level, the node N2 is set almost to the intermediate voltage Vb (Vb+Vth) level. Since the NMOS and PMOS transistors TN2 and TP2 operate in this manner in response to the first and second input signals in1 and in2, the output signal OUT changes with the levels of the power supplies Vdd and Vss.

The operation of the output circuit 10 will now be described. First, the operation when the first input signal in1 has the intermediate voltage Vb level and the second input level in2 has the low potential power supply Vss level is described. In this case, the node N1 is set to the intermediate voltage Vb level. Hence, the voltage between the gate and source of the PMOS transistor TP1 is set to 0 volt and the transistor TP1 is turned off. Further, the node N2 is set to the low potential power supply Vss level. Hence, the voltage between the gate and source of the NMOS transistor TN1 is set to 2.5 volts and the transistor TN1 is turned on. Accordingly, the output circuit 10 outputs the output signal OUT having the low potential power supply Vss level.

Next, the operation when the first input signal in1 has the high potential power supply Vdd level and the second input level in2 has the intermediate voltage Vb level is described. In this case, the node N1 is set to the high potential power supply Vdd level. Hence, the voltage between the gate and source of the PMOS transistor TP1 is set to 2.5 volts and the transistor TP1 is turned on. Further, the potential at the node N2 is set to the intermediate voltage Vb level. Hence, the voltage between the gate and source of the NMOS transistor TN1 is set to 0 volt and the transistor TN1 is turned off. Accordingly, the output circuit 10 outputs the output signal OUT having the high potential power supply Vdd level.

As described above, the output circuit 10 according to the first embodiment outputs the output signal OUT having the low potential power supply Vdd level in response to the first input signal in1 having the intermediate voltage Vb level and the second input signal in2 with the low potential power supply Vss level. The output circuit 10 also outputs the output signal OUT having the high potential power supply Vdd level in response to the first input signal in1 having the high potential power supply Vdd level and the second input signal in2 having the intermediate voltage Vb level.

In the output circuit 10 of the present invention, a voltage exceeding the breakdown voltage (2.5 volts) of the transistor is not generated between the gates of the respective transistors TP1 and TN1 and a source drain. Accordingly, the output signal OUT is amplified in a full scale within the range of power supply Vdd or Vss level (0 to 5 bolts).

To prevent a potential difference that exceeds the breakdown voltage of the PMOS and NMOS transistors TP1 and TN1 from occurring between the nodes N1 and N2, it is desirable that the rise and fall timing of the second input signal is set as described below. In other words, when the output signal OUT is rising, the second input signal in2 is set to rise earlier than the first input signal in1. Hence, the potential at the node N2 increases earlier than that at the node N1, thereby preventing a sudden expansion of the potential difference. Further, when the output signal OUT is falling, the second input signal in2 is set to fall later than the first input signal n1. Hence, the potential at the node N2 falls later than that at the node N1, thereby preventing a sudden expansion of the potential difference.

(Second Embodiment)

FIG. 4 is a circuit diagram of an output circuit 10a according to a second embodiment of the present invention. The output circuit 10a includes first and second inverter circuits 15 and 16. The first inverter circuit 15 has an input terminal that receives the first input signal in1 and an output terminal connected to the node N1. The second inverter circuit 16 has an input terminal that receives the second input signal in2 and an output terminal connected to the node N2. The first and second inverter circuits 15 and 16 form a source voltage control circuit. The power from the high potential power supply Vdd and a power supply with the intermediate voltage Vb are supplied to the first inverter circuit 15. The power from the power supply with the intermediate voltage Vb and the low potential power supply Vss are supplied to the second inverter circuit 16.

The first inverter circuit 15 sets its output terminal (i.e. node N1) to the intermediate voltage Vb level in response to the first input signal in1 having the high potential power supply Vdd level. The first inverter circuit 15 also sets the node N1 to the high potential power supply Vdd level in response to the first input signal in1 having the intermediate voltage Vb level.

The second inverter circuit 16 sets its output terminal (i.e. node N2) to the low potential power supply Vss level in response to the second input signal in2 having the intermediate voltage Vb level. The second inverter circuit 16 also sets the node N2 to the low potential power supply Vss in response to the second input signal in2 having the intermediate voltage Vb level.

Because the first and second inverter circuits 15 and 16 operate in this manner in response to the first and second input signals in1 and in2, the output signal OUT is amplified in a full scale within the range of power supply Vdd or Vss level.

The operation of the output circuit in which the first input signal in1 has the high potential power supply Vdd level and the second input level in2 has the intermediate voltage Vb level is now described. In this case, the node N1 is set to the intermediate voltage Vb level. Hence, the voltage between the gate and source of the PMOS transistor TP1 is set to 0 volts and the transistor TP1 is turned off. Further, the node N2 is set to the low potential power supply Vss level. Hence, the voltage between the gate and source of the NMOS transistor TN1 is set to 2.5 volts and the transistor TN1 is turned on. Thus, the output circuit 10a outputs the output signal OUT having the low potential power supply Vss level.

The operation of the output circuit in which the first input signal in1 has the intermediate voltage Vb level and the second input level in2 has the lower potential power Vss level is now described. In this case, the node N1 is set to the high potential power supply Vdd level. Hence, the voltage between the gate and source of the PMOS transistor TP1 is set to 2.5 volts and the transistor TP1 is turned on. Further, the potential at the node N2 is set to the intermediate voltage Vb level. Hence, the voltage between the gate and source of the NMOS transistor TN1 is set to 0 volt and the transistor TN1 is turned off. Thus, the output circuit 10a outputs the output signal OUT having the high potential power supply Vdd level.

As described above, the output circuit 10a according to the second embodiment outputs the output signal OUT having the low potential power supply Vss level in response to the first input signal in1 having the high potential power supply Vdd level and the second input signal in2 having the intermediate voltage Vb level. The output circuit 10a also outputs the output signal OUT having the high potential power supply Vdd level in response to the first input signal in1 with the intermediate voltage Vb level and the second input signal in2 having the low potential power supply Vss level. Also in the output circuit 10a of the second embodiment, a voltage that exceeds the breakdown voltage (2.5 volts) of the transistor between the gates of the respective transistors TP1 and TN1 and a source drain is not generated. Accordingly, the output signal OUT is amplified in a full scale within the range of power supply Vdd or Vss level (0 to 5 volts).

To prevent a potential difference that exceeds the breakdown voltage of the transistors TP1 and TN1 from occurring between the nodes N1 and N2, it is desirable that the rise and fall of the second input signal be set as described below. In other words, when the output signal OUT is rising, the second input signal in2 is set to decrease earlier than the first input signal in1 so that the potential at the node N2 increases before that at the node N1. Further, when the output signal in1 is falling, the second input signal in2 is set to rise later than the first input signal in1 so that the potential at the node N2 decreases later than that at the node N1.

The second embodiment uses the first and second inverter circuits 15 and 16 instead of the first and second source followers 12 and 13. Accordingly, the potential at the node N1 will not decrease beyond the threshold of the transistor TN2 and the potential at the node N1 will not increase beyond the threshold of the transistor TN2. Consequently, the output signal OUT is amplified in a full scale within the range of power supply Vdd or Vss level.

(Third Embodiment)

FIG. 5 is a circuit diagram of a level converter circuit 20 according to a third embodiment of the present invention. The level converter circuit 20 includes an input circuit 21 and the output circuit 10a (FIG. 4). The input circuit 21 includes PMOS transistors TP3 to TP6, NMOS transistors TN3 to TN5, and resistors R1 and R2.

The NMOS transistor TN3 has a drain connected to the high potential power supply Vdd through the MOS transistor TN4 and the PMOS transistor TP3, a source connected to the low potential Vss, and a gate receiving an input signal in0. The input signal in0 changes between the intermediate voltage Vb level and the low potential power supply Vss level. The intermediate voltage Vb is supplied to the gate of the PMOS transistor TN4.

The PMOS transistors TP3 and TP4 have their gates connected together and form a current mirror circuit 22. The PMOS transistor TP3 has a drain connected to its own gate and a source connected to the high potential power supply Vdd. The PMOS transistor TP4 has a source connected to the high potential power supply Vdd and the intermediate voltage Vb is supplied to the drain through the resistor R1. A node N3 between the drain of the PMOS transistor TP4 and the resistor R1 is connected to the input terminal of the first inverter circuit 15. Accordingly, the potential at the node 3 is supplied to the first inverter circuit 15 as the first input signal in1.

The NMOS transistor TN5 has a drain connected to the intermediate voltage Vb through the PMOS transistor TP5, a source connected to the low potential power supply Vss, and a gate responsive to the input signal in0.

The PMOS transistors TP5 and TP6 have their gates connected together and form a second current mirror circuit 23. The PMOS transistor TP5 has a drain connected to its own gate. The PMOS transistor TP6 has a source connected to the intermediate voltage Vb and a drain connected to the low potential power supply Vss through the resistor R2. A node N4 between the drain of the PMOS transistor TP6 and the resistor R2 is connected to the input terminal of the first inverter circuit 16. Accordingly, the potential at the node N4 is supplied to the first inverter circuit 16 as the second input signal in2.

Preferably, the resistor R2 has a lower resistance than the resistor R1. Accordingly, the drain current of the PMOS transistor TP6 is lower than that of the PMOS transistor TP4.

The operation of the level converter circuit 20 will now be described. When the input signal in0 has the intermediate voltage Vb level, the NMOS transistors TN3 and TN5 are turned on. Thereupon, the source potential of the NMOS transistor TN4 decreases and the transistor TN4 is turned on. The current mirror circuit 22 operates such that the high potential power supply Vdd is supplied to the node N3 through the PMOS transistor TP4, and the node N3 (i.e. first input signal in1) is set to the high potential power supply Vdd level. Further, the current mirror 23 operates such that the intermediate voltage Vb is supplied to the node N4 through the PMOS transistor TP6 and then the node N4 (i.e. second input signal in2) is set to the intermediate voltage Vb level.

The output circuit 10a outputs the output signal OUT having the low potential power supply Vss level in response to the first input signal in1 having the high potential power supply Vdd level and the second input signal in2 having the intermediate voltage Vb level.

When the input signal in0 has the low potential power supply Vss level, the NMOS transistors TN3 and TN5 are turned off. Thereupon, the NMOS transistor TN4 is turned off and the current mirror circuit 22 enters the non-operating state and then the electric charge at the node N3 is discharged through the resistor R2. Thus, the node N4 is set to the low potential power supply Vss level.

The output circuit 10a outputs the output signal OUT with the high potential power supply Vdd level in response to the first input signal in1 with the intermediate voltage Vb level and the second input signal in2 with the low potential power Vss level.

As described above, the level converter circuit 20 receives the input signal in0 with the intermediate voltage Vb level and outputs the output signal OUT with the low potential power supply Vss level. The level converter circuit 20 also receives the input signal in0 having the low potential power supply Vss level and outputs the output signal OUT with the high potential power supply Vdd level.

Since the resistor R2 has a lower resistance than the resistor R1, the second input signal in2 falls earlier than the first input signal in1 while the output signal OUT is rising. Accordingly, the potential at the node N2 rises earlier than that at the node N1. Further, since the drain current of the PMOS transistor TP6 is lower than that of the PMOS transistor TP4, the second input signal in2 rises later than the first input signal in1 when the output signal OUT is falling. Accordingly, the potential at the node N2 decreases later than the potential at the node N1. As a result, a sudden expansion of the potential difference between the nodes N1 and N2 is prevented.

In the third embodiment, the output signal OUT is generated using only the single input signal in0 that changes between the intermediate voltage Vb level and low potential power supply Vss level. Accordingly, the number of input signals is decreased and the number of input signal lines is reduced.

(Fourth Embodiment)

Figure 6:
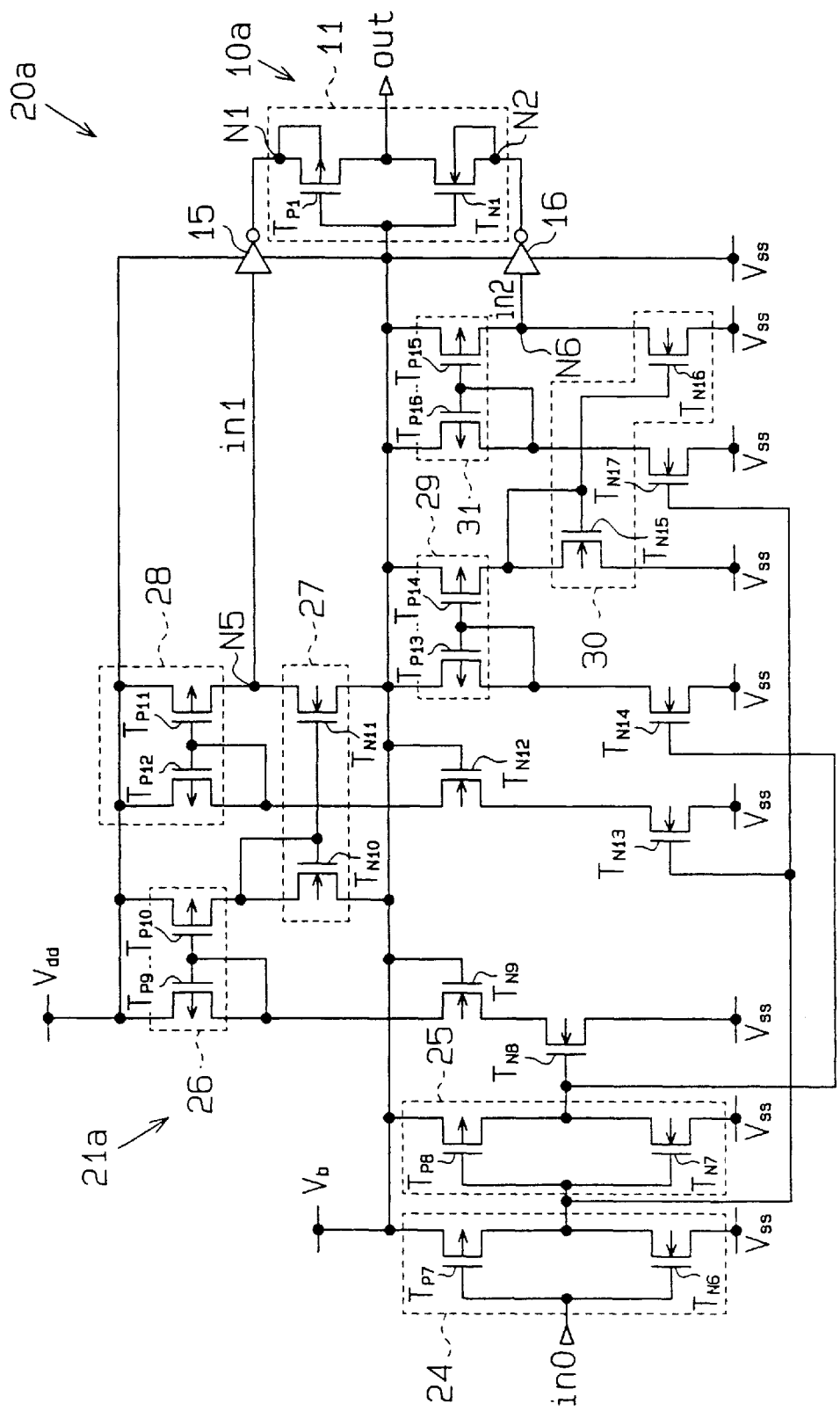
FIG. 6 is a circuit diagram of a level converter circuit according to a fourth embodiment of the present invention.

FIG. 6 is a circuit diagram of a level converter circuit 20a according to a fourth embodiment of the present invention. The level converter circuit 20a includes an input circuit 21a and the output circuit 10a of FIG. 4. The input circuit 21a is equipped with PMOS transistors TP7 to TP16 and NMOS transistors TN6 and TN17.

The PMOS transistor TP7 and NMOS transistor TN6 form a CMOS inverter circuit 24. The inverter circuit 24 receives power from a power supply with the intermediate voltage Vb level and the low power supply Vss. The inverter 24 has an input terminal for receiving the input signal in0 and an output terminal for outputting an inverted input signal. The input in0 changes between the intermediate voltage Vb level and low potential power supply Vss level.

The PMOS transistor TP8 and NMOS transistor TN7 form a second CMOS inverter circuit 25. The inverter circuit 25 receives power from the power supply the power with the intermediate voltage Vb level and the low potential power supply Vss. The inverter circuit 25 has an input terminal connected to the output terminal of the inverter 24 and an output terminal for outputting a signal having the same value as the input signal in0.

The NMOS transistor TN8 has a gate connected to the output terminal of the inverter 25, a drain connected to the high potential power supply Vdd through the NMOS transistor TN9 and the PMOS transistor TP9, and a source connected to the low potential power supply Vss. The NMOS transistor TN9 has a gate that receives the intermediate voltage Vb.

The PMOS transistors TP9 and TP10 have their gates connected together and form a current mirror circuit 26. The PMOS transistor TP9 has a source connected to the high potential power supply Vdd and a drain connected to its own gate. The PMOS transistor TP10 has a source connected to the high potential power supply Vdd and a drain connected to the intermediate voltage Vb through the NMOS transistor TN10.

The NMOS transistors TN10 and TN11 have their gates connected together and form a second current mirror circuit 27. The NMOS transistor TN10 has a drain connected to its own gate and a source connected to the intermediate voltage Vb. The NMOS transistor TN11 has a source connected to the intermediate voltage Vb and a drain connected to the high potential power supply Vdd through the PMOS transistor TP11.

The PMOS transistors TP11 and TP12 have their gates connected together and form a third current mirror circuit 28. The PMOS transistor TP12 has a drain connected to its own gate and a source connected to the high potential power supply Vdd. The drain of the transistor TP12 is also connected to the low potential power supply Vss through the NMOS transistors TN12 and TN13. The NMOS transistor TN12 has a gate connected to the intermediate voltage Vb. The NMOS transistor TN13 has a gate connected to the output terminal of the first CMOS inverter circuit 24.

The drains (i.e. node N5) of the PMOS transistor TP11 and the MOS transistor TN11 are connected to the input terminal of the inverter circuit 15. In other words, the potential at the node N5 is supplied to the inverter circuit 15 as the first input signal in1.

The NMOS transistor TN14 has a gate connected to the output terminal of the second CMOS inverter 25, a source connected to the low potential power supply Vss, and a drain connected to the intermediate voltage Vb through the PMOS transistor TP13.

The PMOS transistors TP13 and TP14 have their gates connected together and form a fourth current mirror circuit 29. The PMOS transistor TP13 has a drain connected to its own gate. The PMOS transistor TP14 has a source connected to the intermediate voltage Vb and a drain connected to the low potential power supply Vss through the NMOS transistor TN15.

The NMOS transistors TN15 and TN16 have their gates connected together and form a current circuit 30. The NMOS transistor TN15 has a drain connected to its own gate. The NMOS transistor TN16 has a source connected to the low potential power supply Vss and a drain connected to the intermediate voltage Vb through the PMOS transistor TP15.

The PMOS transistors TP15 and TP16 have their gates connected together and form a fifth current mirror circuit 31. The PMOS transistor TP15 has a drain connected to its own gate. The PMOS transistor TP16 has a source connected to the intermediate voltage Vb and a drain connected to the low potential power supply Vss through the NMOS transistor TP17. The NMOS transistor TN17 has a gate connected to the output terminal of the first CMOS inverter circuit 24.

The drain (i.e. node N6) of the PMOS transistor TP15 and the NMOS transistor TN16 is connected to the input terminal of the second inverter circuit 16. In other words, the potential at the node N6 is supplied to the second inverter circuit 16 as the second input signal in2.

In the fourth embodiment, the drain current of the NMOS transistor TN16 is higher than the drain current of the NMOS transistor TN11 and the drain current of the PMOS transistor TP15 is lower than the drain current of the PMOS transistor TP11.

Next, the operation of the level converter circuit 20a in which the input in0 has the low potential power supply Vss level will be described.

The inverter circuit 24 outputs an output signal with the intermediate voltage Vb level in response to the input signal in0 with the low potential power supply Vss level and the inverter circuit 25 outputs an output signal with the low potential power supply level Vss level.

The NMOS transistor TN13 turns on in response to the inverter circuit 24 output signal with the intermediate voltage Vb level. Thereupon, the source potential of the NMOS transistor TN12 drops and the transistor TN12 is turned on, and then the current mirror circuit 28 operates.

The NMOS transistor TN8 turns off in response to an output signal with the low potential power supply Vss level from the inverter circuit 25. Thereupon, the NMOS transistor TN9 is tuned off and the current mirror circuits 26 and 27 enter the non-operating state. Thus, the power from the high potential power supply Vdd is supplied to the node N5 through the PMOS transistor TP11 and the potential at the node N5 rises up to the vicinity of the high potential power supply Vdd level. In other words, the first input signal in1 is set to the high potential power supply Vdd level.

The NMOS transistor TN17 turns on in response to an output with the intermediate voltage Vb level from the inverter circuit 24 and the current mirror circuit 31 operates.

The NMOS transistor TN14 turns off in response to an output with the low potential power supply Vss level from the inverter circuit 25 and the current mirror circuits 29 and 30 enter the non-operating state. Thus, the intermediate voltage Vb is supplied to the node N6 through the PMOS transistor TP15 and the potential at the node N6 rises up to vicinity of the intermediate voltage Vb level. In other words, the second input signal in2 is set to the intermediate voltage Vb level.

The output circuit 10a outputs the output signal OUT with the low potential power supply Vss level in response to the first input signal in1 with the high potential power supply Vdd level and the second input in2 with the intermediate voltage Vb level.

Next, the operation of the level converter circuit 20a in which the input signal in0 has the intermediate voltage Vb level will be described.

The NMOS transistor TN13 is turned off in response to an output signal with the intermediate voltage Vb level from the inverter circuit 24, and the current mirror circuit 28 enters the non-operating state.

The NMOS transistor TN8 is turned on in response to an output signal with the intermediate voltage Vb level from the inverter circuit 25. Thereupon, the source potential of the NMOS transistor TN9 drops and the transistor TN9 is turned on, and then the current mirror circuits 26 and 27 operate. Thus, the charge at the node N5 is discharged through the NMOS transistor TN11 and the potential at the node N5 drops to vicinity of the intermediate voltage Vb level. In other words, the first input signal in1 is set to the intermediate voltage Vb level.

The NMOS transistor TN17 turns off in response to an output signal with the low potential power supply from the inverter circuit 24 and the current mirror circuit 31 enters the non-operating state.

The NMOS transistor TN14 turns on in response to an output signal with the intermediate voltage Vb level from the inverter circuit 25 and the current mirror circuits 29 and 30 operate. Thus, the charge at the node N6 is discharged through the NMOS transistor TN16 and the potential at the node N6 drops to the vicinity of the low potential power supply Vss level. In other words, the second input signal in2 is set to the low potential power supply Vss level.

The output circuit 10a outputs the output signal OUT with the high potential power supply Vdd level in response to the first input signal in1 with the intermediate voltage Vb level and the second input signal in2 with the low potential power supply Vss level.

The level converter circuit 20a according to the fourth embodiment receives the input signal in0 with the low potential power supply Vss level and outputs the output signal OUT with the low potential power supply Vdd level. The level converter circuit 20a also inputs the input signal in0 with the intermediate voltage Vb level and outputs the output signal OUT with the high potential power supply Vdd level. The output circuit 10a receives the output signal OUT amplified in a full scale within the range of power supply Vdd or Vss level (0 to 5 volts).

Since the drain current of the NMOS transistor TN16 is higher than that of the NMOS transistor TN11, the second input signal in2 falls earlier than the first input signal in1 when the output signal OUT is rising. In other words, the potential at the node N2 rises earlier than the potential at the node N1.

Since the drain current of the PMOS transistor TP15 is lower than that of the PMOS transistor TP11, the second input signal in2 rises later than the first input signal in1 when the output signal OUT is falling. In other words, the potential at the node N2 drops later than the potential at the node N1. Accordingly, a sudden expansion of the potential difference between the nodes N1 and N2 is prevented.

Because the charge at the nodes N5 and N6 is discharged through the transistors TN11 and TN16, respectively, the discharge time is shortened. Accordingly, the level converter 20a according to the fourth embodiment is suitable for high-speed operation.

(Fifth Embodiment)

Figure 7:
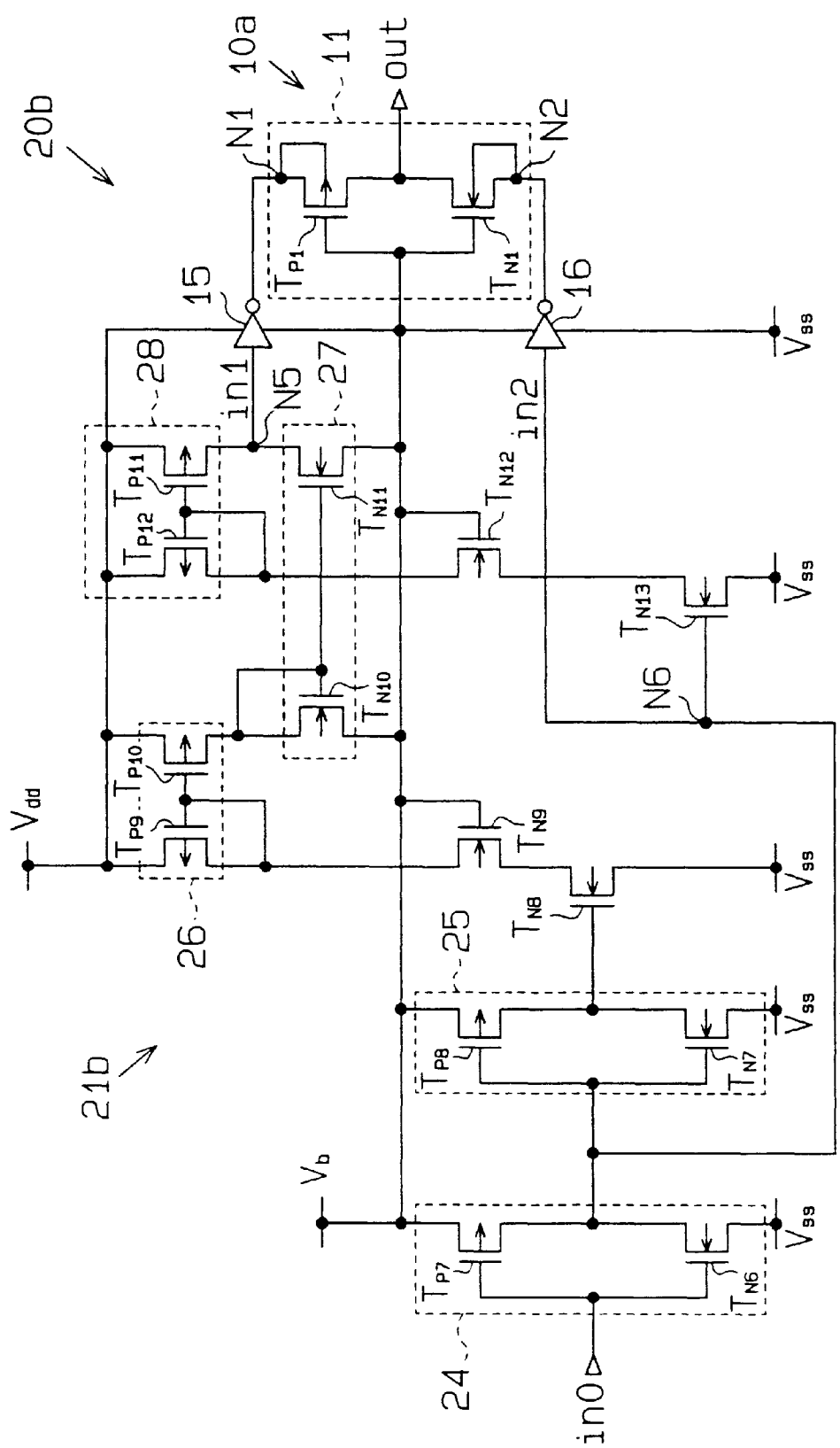
FIG. 7 is a circuit diagram of a level converter circuit according to a fifth embodiment of the present invention.

FIG. 7 is a circuit diagram of a level converter circuit 20b according to a fifth embodiment of the present invention. The level converter circuit 20b does not include the PMOS transistors TP13 to TP16 and NMOS transistors TN14 to TN 17 of the level converter circuit 20 of FIG. 6. In the level converter circuit 20a of FIG. 6, since the potential at the output terminal of the inverter circuit 24 and the potential at the input terminal (node N6) of the inverter circuit 16 are the same, the output terminal of the inverter circuit 24 is connected to the output terminal of the inverter 16. Accordingly, in the fifth embodiment, the output signal of the inverter circuit 24 is the second input signal in2.

The level converter circuit 20b receives the input signal in0 having the low potential power supply Vss level in the same way as the level converter circuit 20a of FIG. 6 and outputs the output signal OUT with the low potential power supply Vss level. The level converter circuit 20b also receives the input signal in0 with the intermediate voltage Vb level and outputs the output signal OUT with the high potential power supply Vdd level.

(Sixth Embodiment)

Figure 8:
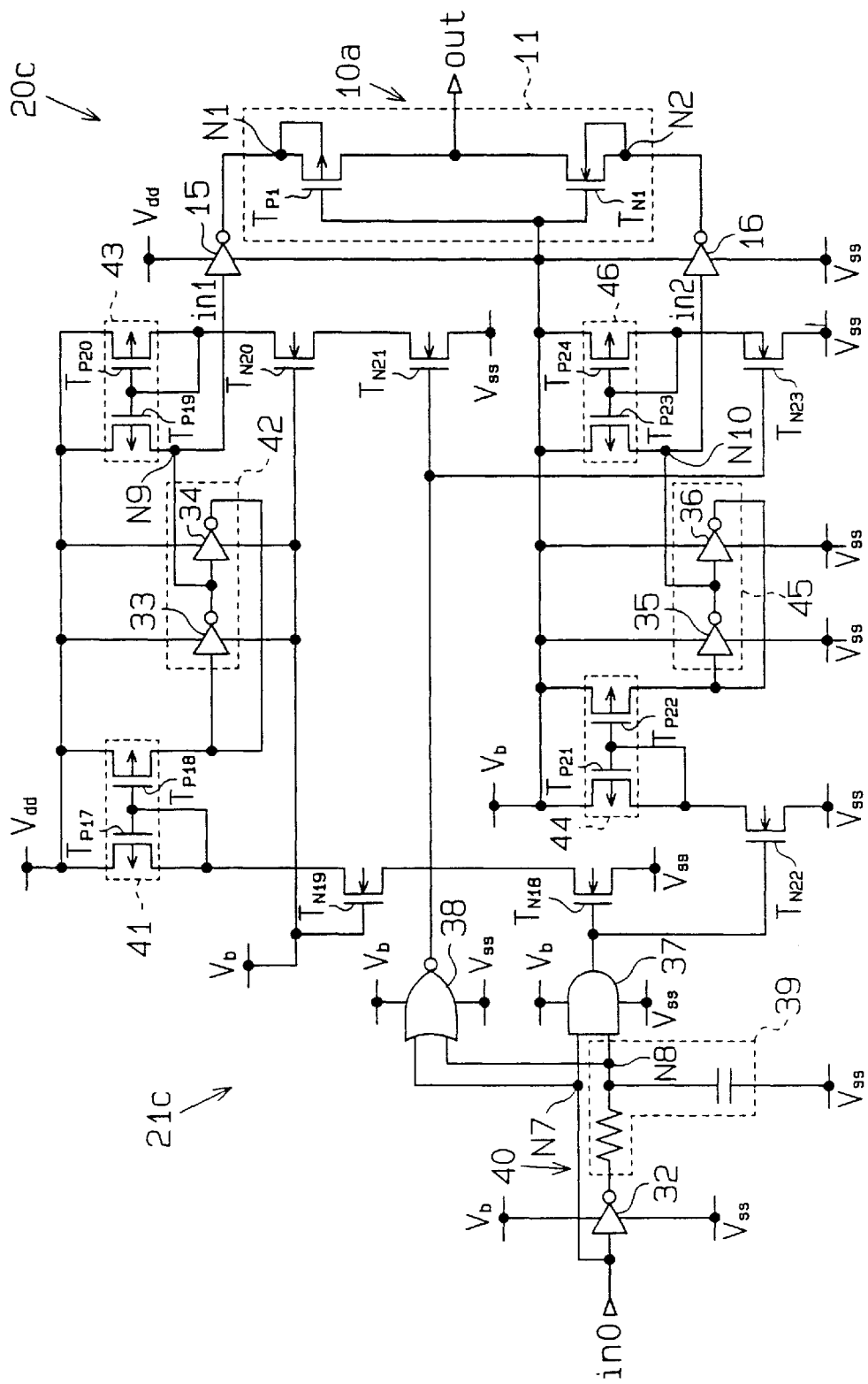
FIG. 8 is a circuit diagram of a level converter circuit according to the sixth embodiment of the present invention.

FIG. 8 is a circuit diagram of a level converter circuit diagram 20C according to a sixth embodiment of the present invention. The level converter circuit 20c includes an input circuit 21c and the output circuit 10a. The input circuit 21c is equipped with inverter circuits 32 to 36, an AND circuit 37, a NOR circuit 38, an integrating circuit 39 preferably comprising a resistor and a capacitor, PMOS transistors TP17 to TP24, and NMOS transistors TN18 to TN23. The integrating circuit 39, for example, can be configured with multiple inverter circuits connected in series.

The AND circuit 37 has a first input terminal (node N7) for receiving the input signal in0, a second input terminal (node N8) for receiving the input signal in0 by way of the inverter circuit 32 and the integrating circuit 39, and an output circuit. The inverter circuit 32 and the integrating circuit 39 together form a delay circuit 40. The NOR circuit 38 has first and second input terminals respectively connected to the first and second input terminals (i.e. node N7 and N8) of the AND circuit 37, and an output terminal. The inverter circuit 32, AND circuit 37, and NOR circuit 38 receive power from a power supply having the intermediate Vb level and the low potential power supply Vss.

The NMOS transistor TN18 has a gate connected to the output terminal of the AND circuit 37, a drain connected to the high potential power supply Vdd through the NMOS transistor TN19 and the PMOS transistor TP17, and a source connected to the low potential power supply Vss. The NMOS transistor TN19 has a gate connected to the intermediate voltage Vb.

The PMOS transistors TP17 and TP18 have their gates connected together and form a current mirror circuit 41. The PMOS transistor TP17 has a drain connected to its own gate and a source connected to the high potential power supply Vdd. The PMOS transistor TP18 has a source connected to the high potential power supply Vdd and a drain connected to the input terminal of an inverter circuit 33.

The inverter circuits 33 and 34 form a latch circuit 42 that receives power from the high potential power supply Vdd and the power supply with the intermediate voltage Vb level.

The PMOS transistors TP19 and TP20 have their gates connected together and form a current mirror circuit 43. The PMOS transistor TP19 has a drain (node N9) connected to its own gate and the output terminal of the inverter circuit 33, and a source connected to the high potential power supply. The PMOS transistor TP20 has a source connected to the high potential power supply Vdd and a drain connected to the low potential power supply Vss through the NMOS transistors TN20 and TN21. The NMOS transistor TN20 has a gate connected to the intermediate voltage Vb. The NMOS transistor TN21 has a gate connected to the output terminal of the NOR circuit 38.

The node N9 is connected to the input terminal of the first inverter circuit 15. In other words, the potential at the node N9 is supplied to the first inverter circuit 15 as the first input signal in1.

The NMOS transistor TN22 has a gate connected to the output terminal of the AND circuit 37, a drain connected to the intermediate voltage Vb through the PMOS transistor TP21, and a source connected to the low potential power supply Vss.

The PMOS transistors TP21 and TP22 have their gates connected together and form a current mirror circuit 44. The PMOS transistor TP 21 has a drain connected to its own gate and a source connected to the power supply with the intermediate voltage Vb level. The PMOS transistor TP22 has a source connected to the intermediate voltage Vb and a drain connected to the input terminal of the inverter circuit 35.

The inverter circuits 35 and 36 form a latch circuit 45 and receive power from the power supply with the intermediate voltage Vb level and the low potential power supply Vss.

The PMOS transistors TP23 and TP24 have their gates connected together and form a current mirror circuit 46. The PMOS transistor TP23 has a drain (node N10) connected to its own gate and the output terminal of the inverter circuit 35, and a source connected to the intermediate potential power supply Vb. The PMOS transistor TP24 has a source connected the intermadiate potential power supply Vb and a drain connected to the low potential power supply Vss through the NMOS transistor TP23. The PMOS transistor TP24 has a gate connected to its drain and the source of the transistor TN23.

The node N10 is connected to the input terminal of the second inverter circuit 16. In other words, the potential at the node N10 is supplied to the second input signal in2.

Next, the operation of the level converter circuit 20c in which the input signal in0 has the low potential power supply Vss level will described.

The potential at the node N7 is immediately set to the low potential power supply Vss level. The potential at the node N8 is first set to the low potential power supply Vss level and changes to the intermediate voltage Vb level after a predetermined delay time of the delay circuit 40 has elapsed. Accordingly, the NMOS transistor TN18 turns off in response to an output signal with the low potential power supply Vss level from the AND circuit 37. The NMOS transistor TN19 is turned off and the current mirror circuit 41 enters the non-operating state.

The NOR circuit 38 first outputs an output signal with the intermediate voltage Vb level and outputs an output signal with the low potential power supply Vss level after a predetermined delay time has elapsed. The NMOS transistor TN21 turns on in response to an output signal with the intermediate voltage Vb level from the NOR circuit 38. Thereupon, the source potential of the NMOS transistor TN20 drops and the transistor TN20 turns on, and then the current mirror 43 operates. Thus, the high potential power supply Vdd is supplied to the node N9 through the PMOS transistor TP19 and the potential at the node N9 rises to the about the high potential power supply Vdd level. In other words, the first input signal in1 is set to the high potential power supply Vdd level. At this time, the latch circuit 42 holds the potential with the high potential power supply Vdd level at the node N9.

The NMOS transistor TN22 is turned off in response to an output signal having the low potential power supply Vss level from the NAND circuit 37, and the current mirror circuit 44 enters the non-operating state.

The NMOS transistor TN23 turns on in response to an output signal with the intermediate voltage Vb level from the NOR circuit 38 and the current mirror circuit 46 operates. Thereupon, the intermediate voltage Vb is supplied to the node N10 through the PMOS transistor TP23, and the potential at the node 10 rises to about the intermediate voltage Vb level. In other words, the second input signal in2 is set to the intermediate voltage Vb level at the node N10. At this time, the latch circuit 45 holds potential with the intermediate voltage Vb level.

After a predetermined delay time has elapsed, the NMOS transistor TN21 turns off in response to an output signal with the low potential power supply Vss level from the NOR circuit 38. Thereupon, the NMOS transistor TN20 is turned off and the current mirror circuit 43 enters the non-operating state. At this time, since the latch circuit 42 holds the potential at the node N9 with the high potential power supply Vdd level, the first input level in1 is maintained at the high potential power supply Vdd level.

The NMOS transistor TN23 turns off in response to an output signal with the low potential power supply Vss level from the NOR circuit 38, and the current mirror circuit 46 enters the non-operating state. At this time, since the latch circuit 45 holds the potential at the node N10 at the intermediate voltage Vb level, the second input signal in2 is maintained at the intermediate voltage Vb level.

In the sixth embodiment, when the input signal in0 has the low potential power supply Vss level, the NOR circuit 38 output a one-shot pulse signal that changes from the intermediate voltage Vb level to the low potential power supply Vss level after the predetermined delay time of the delay circuit 40 has elapsed. Accordingly, since the on time of the NMOS transistors TN21 and TN23 is shortened, the feedthrough current applied to the transistors TN21 and TN23 is reduced.

The output circuit 10a outputs the output signal OUT with the low potential power supply Vss level in response to the first input signal in1 with the high potential power supply Vdd level and the second input signal in2 with the intermediate voltage Vb level.

The operation of the level converter circuit 20c in which the input signal in0 has the intermediate voltage Vb level will now be described.

The potential at the node N7 is immediately set to the intermediate voltage Vb level. The potential at the node N8 is first set to the intermediate voltage Vb level and set to the low potential power supply vss level after the predetermined delay time of the delay circuit 40 has elapsed. Accordingly, the AND circuit 37 first outputs an output signal with the intermediate voltage Vb level and then outputs an output signal with the low potential power supply Vss level after a predetermined delay time has elapsed. The NOR circuit 38 outputs an output signal with the low potential power supply Vss level.

The NMOS transistor TN21 turns off in response to an output signal with the low potential power supply Vss level from the NOR circuit 38. Thereupon, the NMOS transistor TN20 is turned off and the current mirror circuit 43 enters the non-operating state.

The NMOS transistor TN18 turns on in response to an output signal with the intermediate voltage Vb level from the AND circuit 37. Thereupon, the source potential of the MOS transistor TN19 drops and the transistor TN19 is turned on and the current mirror circuit 41 operates.

Then, power is supplied from the high potential power supply Vdd to the input terminal of the inverter circuit 33 through the PMOS transistor TP18, and the potential at the input terminal of the inverter 33 rises to about the high potential power supply Vdd level. Thus, the potential (i.e. first input signal in1) is set to the intermediate voltage Vb level. At this time, the latch circuit 42 holds the potential at the node N9 at the intermediate voltage Vb level.

The NMOS transistor TN22 is turned on in response to an output signal with the intermediate voltage Vb level from the AND circuit 37 and the current mirror circuit 44 operates. Thereupon, the intermediate voltage Vb is supplied to the input terminal of the inverter circuit 35 through the PMOS transistor TP22, and the potential at the input terminal rises to about the intermediate voltage Vb level. Thus, the potential at the node N10 (i.e. second input signal in2) is set to the low potential power supply Vss level. At this time, the latch circuit 45 holds potential with the low potential power supply Vss level at the node N10.

The NMOS transistor TN23 is turned off in response to an output signal with the low potential power supply Vss level from the NOR circuit 38 and the current mirror circuit 46 enters the non-operating state.

After a predetermined delay time has elapsed, the NMOS transistor TN18 turns off in response to an output signal with the low potential power supply Vss level from the AND circuit 37. The NMOS transistor TP19 is turned off and the current mirror circuit 41 enters the non-operating state. At this time, the latch circuit 42 holds the potential at the node N9 with the intermediate voltage Vb level. Accordingly, the first input signal in1 is maintained at the intermediate voltage Vb level.

The NMOS transistor TN22 turns off in response to an output signal with the low potential power supply Vss level from the AND circuit 37 and the current mirror circuit 44 enters the non-operating state. At this time, the latch circuit 45 holds the potential at the node N10 with the low potential power supply Vss level. Accordingly, the second input signal in2 is maintained at the low potential power supply Vss level.

In the sixth embodiment, when the input signal in0 has the intermediate voltage Vb level, the AND circuit 37 outputs a one-shot pulse signal that changes from the intermediate voltage Vb level to the low potential power supply Vss level after a predetermined delay time has elapsed. Accordingly, since the on time of the NMOS transistors TN18 and TN22 is shortened, the feedthrough current applied to the transistors TN18 and TN22 is reduced.

The output circuit 10a outputs an output signal OUT with the high potential power supply Vdd level in response to the first input signal in1 with the intermediate voltage Vb level and the second input signal in2 with the low potential power supply Vss level.

(Seventh Embodiment)

Figure 9:
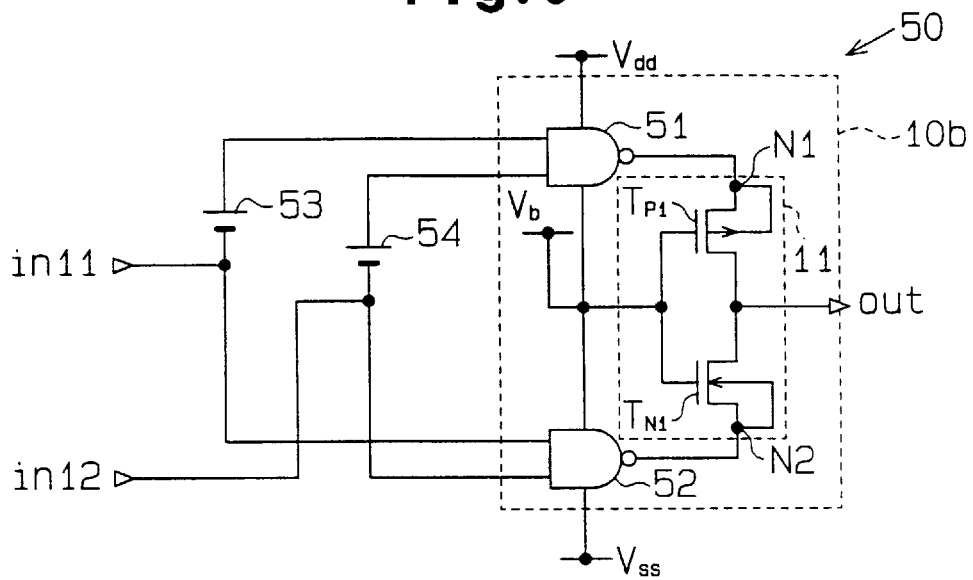
FIG. 9 is a circuit diagram of a NAND circuit according to a seventh embodiment of the present invention.

FIG. 9 is a circuit diagram of a NAND circuit 50 according to a seventh embodiment of the present invention. The NAND circuit 50 is equipped with an output circuit 10b and power supplies 53 and 54. The output circuit 10b has first and second NAND circuits 51 and 52 in place of the first and second inverter circuits 15 and 16 of the output circuit 10a. The first NAND circuit 51 receives power from the high potential power supply Vdd and a power supply with the intermediate voltage Vb level. The second NAND circuit 52 receives power from the power supply with the intermediate voltage Vb level and the low potential power supply Vss.

The first NAND circuit 51 has a first input terminal for receiving an input signal in11 by way of the power supply 53 for shifting levels, a second input terminal for receiving an input signal in12 by way of a power supply 54 for shifting levels, and an output terminal connected to the node N1.

The input signals in11 and in12 change between the low potential power supply Vss level and the intermediate voltage Vb level. The power supplies 53 and 54 shift the input signals in11 and in12 that change between the low potential power supply Vss level and the intermediate voltage Vb level to a signal which changes between the intermediate voltage Vb level and the high potential power supply Vdd level. The shifted signals are supplied to the first NAND circuit 51.

The second NAND circuit 52 has a first input terminal that receives the input signal in11, a second input terminal that receives the input signal in12, and an output terminal connected to the node N2.

The operation of the NAND circuit 50 in which both the input signals in11 and in12 have the low potential power supply level will now be described. In this case, the power supplies 53 and 54 shift the input signals in11 and in12 to a signal with the intermediate voltage Vb level.

The first NAND circuit 51 receives the shifted signal and outputs an output signal with the high potential power supply Vdd level. The second NAND circuit 52 receives the input signals in11 and in12 with the low potential power supply level and outputs an output signal with the intermediate voltage Vb level. Thus, the potential at the node N1 is set to the high potential power supply Vdd level and the potential at the node N2 is set to the intermediate voltage Vb level. The CMOS inverter circuit 11 (i.e. NAND circuit 50) outputs an output signal OUT with the high potential power supply Vdd level.

The operation of the NAND circuit 50 in which both of the input signals in11 and in12 have the intermediate voltage Vb level will now be described. In this case, the power supplies 53 and 54 shift the input signals to a signal with the high potential power supply Vdd level.

The first NAND circuit 51 receives the shifted signal and outputs an output signal with the intermediate voltage Vb level. The second NAND circuit 52 receives the input signals in11 and in12 with the intermediate voltage Vb level and outputs an output signal with the low potential power supply Vss level. Thus, the potential at the node N1 is set to the intermediate voltage Vb level, and the potential at the node N2 is set to the low potential power supply Vss level. The CMOS inverter circuit 11 (i.e. NAND circuit 50) outputs an output signal OUT with the low potential power supply Vss level.

The operation of the NAND circuit 50 in which the input signal in11 has the intermediate voltage Vb level and the input signal in12 has the low potential power supply level will now be described. In this case, the power supplies 53 and 54 shift the input signal in11 to a signal with the high potential power supply Vdd level and the input signal in12 to a signal with the intermediate voltage Vb level.

The first NAND circuit 51 receives the shifted signal and outputs an output signal with the high potential power supply Vdd level. The second NAND circuit 52 receives the input signal in11 with the intermediate voltage Vb level and the input signal in12 with the low potential power supply Vss level and outputs an output signal with the intermediate voltage Vb level. Thus, the potential at the node N1 is set to the high potential power supply Vdd level and the potential at the node N2 is set to the intermediate voltage Vb level. The CMOS inverter circuit 11 then outputs an output signal OUT with the high potential power supply Vdd level.

Next, the operation of the NAND circuit 50 in which the input signal in11 has the low potential power supply Vss level and the input signal in12 has the intermediate voltage Vb level is described. In this case, the power supplies 53 and 54 shift the input signal in11 to a signal with the intermediate voltage Vb level and shift the input signal in12 to a signal with the high potential power supply Vdd level.

The first NAND circuit 51 receives the shifted signal and outputs an output signal with the high potential power supply Vdd level. The second NAND circuit 52 receives the input signal in11 with the low potential power supply Vss level and the input signal in12 with the intermediate voltage Vb level and outputs an output with the intermediate voltage Vb level. Thus, the potential at the node N1 is set to the high potential power supply Vdd level, and the potential at the node N2 is set to the intermediate voltage Vb level. The CMOS inverter circuit 11 then outputs an output signal OUT with the high potential power supply Vdd level.

In the seventh embodiment, the NAND circuit 50 outputs an output signal OUT with the low potential power supply Vss level in response to both of the input signals in11 and in12 with the intermediate voltage Vb level. The NAND circuit 50 further outputs the output signal OUT with the high potential power supply Vdd level in response to the input signals in11 and in12 at least either of which has the low potential power supply Vss level.

(Eighth Embodiment)

Figure 10:
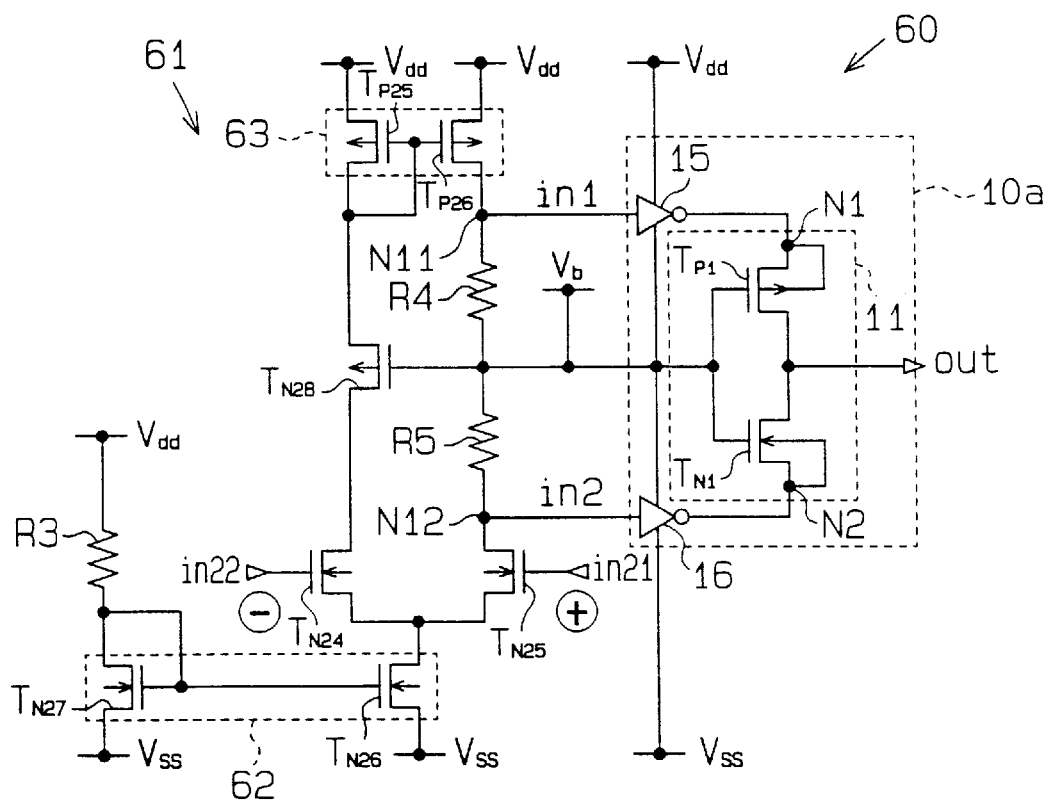
FIG. 10 is a circuit diagram illustrating a op amp circuit according to an eighth embodiment of the present invention.

FIG. 10 is circuit diagram of an op amp circuit 60 according to an eighth embodiment of the present invention. The op amp circuit 60 includes an input circuit 61 and the output circuit 10a of FIG. 4. The input circuit 61 is equipped with PMOS transistors TP25 and TP26, NMOS transistors TN24 to TN28, and resistors R3 to R5.

The NMOS transistors TN24 and TN25 have their sources that are connected together and connected to the low potential power supply Vss through the NMOS transistor TN26. The NMOS transistors TN26 and TN27 have their gates connected together and form a current mirror circuit 62. The NMOS transistor TN27 has its drain and gate connected to the high potential power supply Vdd and the resistor R3 and a source connected to the low potential power supply Vss. The NMOS transistor TN26 and T27 and the resistor R3 form a constant current source.

The NMOS transistor TN24 has a drain connected to the high potential power supply Vdd through the NMOS transistor TN28 and the PMOS transistor TP25 and a gate, which acts as the inverted input terminal of the op amp circuit 60, for receiving an input signal in22. The input signal in22 changes between the intermediate voltage Vb level and the low potential power supply Vss level.

The NMOS transistor TN25 has a drain connected to the intermediate voltage Vb through the resistor R5 and a gate, which act as the non-inverted input terminal, for receiving an input signal in21. The input signal in21 changes between the intermediate voltage Vb level and the low potential power supply Vss level.

The PMOS transistors TP25 and TP26 have their gates connected together and form a current mirror circuit 63. The PMOS transistor TP25 has a drain connected to its own gate and its source connected to the high potential power supply Vdd. The PMOS transistor TP26 has a source connected to the high potential power supply Vdd and a drain connected to the intermediate voltage Vb through the resistor R4.

A node N11 between the PMOS transistor TP26 and the resistor R4 is connected to the input terminal at the first inverter circuit 15. In other words, the potential at the node N11 is supplied to the first inverter 15 as the first input signal in1. A node N12 between the NMOS transistor TN25 and the resistor R5 is connected to the input at the second inverter circuit 16. In other word, the potential at the node N12 is supplied to the second inverter circuit 16 as the second input signal in2.

The resistors R4 and R5 maintain the potential difference between the nodes N11 and N12 in the intermediate voltage Vb level (2.5 V). For example, when the potential at the node N11 rises to about the high potential power supply Vdd level, the potential at the node N12 rises to about the intermediate voltage Vb level. Further, when the potential at the node N12 drops to about the low potential power supply Vss level, the potential at the node N11 drops to about the intermediate voltage Vb level.

The operation of the op amp circuit 60 in which the level of the input signal in22 is higher than the level of the input signal in21 will be described. In this case, the current drive capacity of the NMOS transistor TN24 becomes higher than that of the NMOS transistor TN25. Thereupon, the source potential of the NMOS transistor TN28 drops and the current drive capacity of the transistor N28 increases. The drain current of the PMOS transistor TP25 (and PMOS transistor T26) increases. Further, since the level of the input signal in21 is lower than the level of the input signal in22, the current drive capacity of the NMOS transistor TN25 is suppressed and the drain current of the NMOS transistor TN25 is reduced.

Thus, the potential (i.e. the first input signal in1) at the node N11 rises to about the high potential power supply Vdd level, and the potential (i.e. the second input signal in2) at the node N12 rises to about the intermediate voltage Vb level. Subsequently, the output circuit 10a outputs an output signal OUT that drops to about the low potential power supply Vss level.

Next, the operation of the op amp 60 in which the level of the input signal in22 is lower than that of the input signal in21 will now be described. In this case, the current drive capacity of the NMOS transistor TN24 becomes lower than that of the NMOS transistor TN25. Thereupon, the current drive capacity of the NMOS transistor TN28 is suppressed and the drain current of the PMOS transistor TP25 (and PMOS transistor P26) is reduced. Further, since the level of the input signal in21 is higher than that of the input signal in22, the current drive capacity of the NMOS transistor T25 increases.

Thus, the potential (i.e. the first input signal in1) at the node N11 drops to about the intermediate voltage Vb level, and the potential (second input signal in2) at the node N12 drops to the low potential power supply Vss level. Then, the output circuit 10a outputs an output signal OUT that rises to about the high potential power supply Vdd level.

It should be apparent to those skilled in the art that the present invention may be embodied in many other specific forms without departing from the spirit or scope of the invention. Particularly, it should be understood that the invention may be embodied in the following forms.

The voltage supplied to the input terminal (i.e., the gates of the transistors TP1 and TN1) of the CMOS inverter circuit 11 may be a fixed or variable voltage between the voltage lower than the high potential power supply Vdd level only for the threshold of the PMOS transistor TP1 and the voltage higher than the low potential power supply Vss level only for the threshold of the NMOS transistor TN1.

In the third to sixth and eighth embodiments, the output circuit 10 of FIG. 2 may be used instead of the output circuit 10a of FIG. 4.

Therefore, the present examples and embodiments are to be considered as illustrative and not restrictive and the invention is not to be limited to the details given herein, but may be modified within the scope and equivalence of the appended claims.

What is claimed is:

1. An output circuit comprising: a PMOS transistor and a NMOS transistor connected in series and a potential control circuit connected to the gate and source of the PMOS and the NMOS transistor, for receiving power from a high potential power supply and a low potential power supply, and controlling the voltage applied to the gate and the source of the PMOS transistor and the NMOS transistor in response to an input signal having one of a first level and a second level, wherein the potential control circuit applies a reference voltage to the gates of the PMOS transistor and the NMOS transistor, the reference voltage being between the high potential power supply level and the low potential power supply voltage level, wherein the potential control circuit applies the high potential power supply voltage to the source of the PMOS transistor in response to said input signal with the first level and applies a first voltage to the source of the NMOS transistor to make the NMOS transistor nonconductive, so that an output signal with the high potential power supply voltage is output from a node between the PMOS transistor and the NMOS transistor, and wherein the potential control circuit applies the low potential power supply voltage to the source of the NMOS transistor in response to said input signal having the second level and applies a second voltage to the source of the PMOS transistor to make the PMOS transistor nonconductive, so that an output signal having the low potential power supply voltage is output from the node between the PMOS transistor and the NMOS transistor, and wherein an amplitude of the output signal exceeds a breakdown voltage of the PMOS transistor and the NMOS transistor.

2. The output circuit according to claim 1, wherein the reference voltage is an intermediate voltage between the high potential power supply voltage and the low potential power supply voltage.

3. An output circuit, comprising:
a PMOS transistor and an NMOS transistor connected in series;
a first source follower circuit connected between the source of the PMOS transistor and a high potential power supply, for selectively applying a high potential power supply voltage to the source of the PMOS transistor in response to a first input signal having a voltage that changes between the high potential power supply voltage and a reference voltage, the reference voltage being between the high potential power supply voltage and a low potential power supply voltage;

a second source follower circuit connected between the source of the NMOS transistor and a low potential power supply, for selectively applying the low potential power supply voltage to the source of the NMOS transistor in response to a second input signal having a voltage that changes between the reference voltage and low potential power supply voltage; and an output terminal located at a node between the PMOS transistor and the NMOS transistor for outputting an output signal having one of the high potential power supply voltage and the low potential power supply voltage.

4. The output circuit according to claim 3, further comprising a reference voltage generation circuit connected to the gates of the PMOS transistor and NMOS transistor, for generating the reference voltage and applying the reference voltage to the gates of the PMOS transistor and NMOS transistor.

5. The output circuit according to claim 3, wherein the reference voltage is an intermediate voltage between the high potential power supply voltage and the low potential power supply voltage.

6. The output circuit according to claim 3,
wherein supply of the first and second input signals is timed such that the source voltage of the NMOS transistor changes earlier than the source voltage of the PMOS transistor when the output signal is rising from the low potential power supply voltage to the high potential power supply voltage and the source voltage of the NMOS transistor changes later than the source voltage of the PMOS transistor when the output signal is falling from the high potential power supply voltage to the low potential power supply voltage.

7. An output circuit, comprising;
a PMOS transistor and a NMOS transistor connected in series;
a first inverter circuit connected to the source of the PMOS transistor, for receiving power from a high potential power supply and a reference voltage between the high potential power supply voltage and a low potential power supply voltage, the first inverter receiving a first input signal having a voltage that changes between the high potential power supply voltage and the reference voltage and applying one of the high potential power supply voltage and reference voltage to the source of the PMOS transistor;
a second inverter circuit connected to the source of the NMOS transistor for receiving power from the reference voltage and a low potential power supply, the second inverter circuit receiving a second input signal having a voltage that changes between the reference voltage and the low power supply voltage and applying one of the reference voltage and the low potential power supply voltage to the source of the NMOS transistor; and
an output terminal located at a node between the PMOS transistor and the NMOS transistor for outputting an output signal having one of the high potential power supply voltage and the low potential power supply voltage.

8. The output circuit according to claim 7, further comprising a reference voltage generation circuit connected to the gates of the PMOS transistor and the NMOS transistor, for generating the reference voltage and applying the reference voltage to the gates of the PMOS transistor and the NMOS transistor.

9. The output circuit according to claim 7, wherein the reference voltage is intermediate between the high potential power supply voltage and the low potential power supply voltage.

10. The output circuit according to claim 7,
wherein supply of the first and second input signals is timed such that the source voltage of the NMOS transistor changes earlier than the source voltage of the PMOS transistor when the output signal is rising from the low potential power supply voltage to the high potential power supply voltage and the source voltage of the NMOS transistor changes later than the source voltage of the PMOS transistor when the output signal is falling from the high potential power supply voltage to the low potential power supply voltage.

11. A level converter circuit, comprising:
an input signal converter for receiving power from a high potential power supply and a low potential power supply and converting an external input signal to first and second input signals, the first input signal having a voltage that changes between the high potential power supply voltage and a reference voltage, the reference voltage being between the high potential power supply voltage and the low potential power supply voltage, the second input signal having a voltage that changes between the reference voltage and the low potential power supply voltage; and
an output circuit connected to the input signal converter, for receiving the first and second input signals and outputting an output signal having one of the high potential power supply voltage and the low potential power supply voltage.

12. The level converter circuit according to claim 11,
wherein the output circuit further comprises:
a PMOS transistor and an NMOS transistor connected in series;
a first source follower circuit connected between the source of the PMOS transistor and the high potential power supply, for selectively applying the high potential power supply voltage to the source of the PMOS transistor in response to the first input signal;
a second source follower circuit connected between the source of the NMOS transistor and the low potential power supply, for selectively applying the low potential power supply voltage to the source of the NMOS transistor in response to the second input signal; and
an output terminal located at a node between the PMOS transistor and NMOS transistor that outputs the output signal.

13. The level converter according to claim 11,
wherein the output circuit further comprises:
a PMOS transistor and an NMOS transistor connected in series;
a first inverter circuit connected to the source of the PMOS transistor, for receiving power from the high potential power supply and the reference voltage, the first inverter circuit receiving the first input signal and applying one of the high potential power supply voltage and the reference voltage to the source of the PMOS transistor;
a second inverter circuit connected to the source of the NMOS transistor, for receiving power from the reference voltage and the low potential power supply, the second inverter circuit receiving the second input signal and applying one of the reference voltage and the low potential power supply voltage to the source of the NMOS transistor; and
an output terminal located at a node between the PMOS transistor and the NMOS transistor for outputting an output signal.

14. The level converter circuit according to claim 11,
wherein the input signal converter comprises:
a first current mirror circuit and a first resistor connected in series between the high potential power supply and the reference voltage;
a first switching circuit for selectively activating the first current mirror circuit in response to the external input signal, the first input signal being supplied to the output circuit from a node between the first current mirror circuit and the first resistor;
a second current mirror circuit and a second resistor connected in series between the reference voltage and the low potential power supply; and
a second switching circuit for selectively activating the second current mirror circuit in response the external input signal, the second input signal being supplied to the output circuit from a node between the second current mirror circuit and the second resistor.

15. The level converter circuit according to claim 11,
wherein the input signal converter comprises:
first and second current mirror circuits connected between the high potential power supply and the reference voltage;
a first switching circuit for selectively activating the first current mirror circuit in response to the external input signal;
a second switching circuit for activating the second current mirror circuit complementarily with the first current mirror circuit based on the external input signal, the first input signal being supplied to the output circuit from a node between the first and second current mirror circuits;
third and fourth current mirror circuits connected between the reference voltage and the low potential power supply;
a third switching circuit for selectively activating the third current mirror circuit in response to the external input signal; and
a fourth switching circuit for activating the fourth current mirror circuit complementarily with the third current mirror circuit in response to the external input signal, the second input signal being supplied to the output circuit from a node between the third and fourth current mirrors circuits.

16. The level converter circuit according to claim 11,
wherein the external input signal changes between the reference voltage and low potential power supply voltage, the input signal converter comprising:
first and second current mirror circuits connected between the high potential power supply and the reference voltage;
a first switching circuit for selectively activating the first current mirror in response to the external input signal;
a second switching circuit for activating the second current mirror circuit complementarily with the first current mirror circuit in response to the external input signal, the first input signal being supplied to the output circuit from a node between the first and second mirror circuits; and an inverter for receiving the external input signal and supplying the second input signal to the output circuit.

17. The level converter circuit according to claim 11, wherein the input signal converter comprises:

a one-shot circuit for converting the external input signal to first and second one-shot pulse signals;

a first switching circuit and a first current mirror circuit connected in series between the high potential power supply and the low potential power supply, the first switching circuit selectively activating the first current mirror circuit in response to the first one-shot pulse signal;

a second switching circuit and a second current mirror circuit connected in series between the high potential power supply and the low potential power supply, the second switching circuit activating the second current mirror circuit complementarily with the first current mirror circuit in response to the second one-shot pulse signal;

a first latch circuit connected between the first and second current mirror circuits, for latching the first input signal while the external input signal is changing, the first input signal being supplied to the output circuit from a node between the second current mirror circuit and the first latch circuit;

a third switching circuit and a third current mirror circuit connected in series between the reference voltage and low potential power supply, the third switching circuit selectively activating the third current mirror circuit in response to the first one-shot pulse signal;

a fourth switching circuit and a fourth current mirror circuit connected between the reference voltage and the low potential power supply, the fourth switching circuit activating the fourth current mirror circuit complementarily with the third current mirror circuit in response to the second one-shot pulse signal; and a second latch circuit connected between the third and fourth current mirror circuits for latching the second input signal while the external input signal changes, the second input signal being supplied to the output circuit from a node between the fourth current mirror circuit and the second latch circuit.

18. A logic circuit, comprising:

first and second power supplies for shifting voltages of first and second input signals, thereby generating first and second shifted input signals;

an output circuit connected to the first and second power supplies, for receiving the first and second input signals and the first and second shifted input signals and outputting a predetermined logical signal, the output circuit including:

a PMOS transistor and a NMOS transistor connected in series;

a first NAND circuit connected to the source of the PMOS transistor and receiving power from the high potential power supply and a reference voltage, the reference voltage being between the high potential power supply voltage and the low potential voltage power supply, the first NAND circuit receiving the first and second shifted input signals and applying one of the high potential power supply voltage and the reference voltage to the source of the PMOS transistor;

a second NAND circuit connected to the source of the NMOS transistor and receiving power from the reference voltage and the low potential power supply, the second NAND circuit receiving the first and second input signals and applying one of the reference voltage and the low potential power supply voltage to the source of the NMOS transistor; and an output terminal located at a node between the PMOS transistor and NMOS transistor for outputting a logical signal.

19. An operational amplifier, comprising:

an input circuit for receiving power from a high potential power supply and a low potential power supply and generating first and second voltage signals by comparing first and second input signals with each other, the first signal having one of the high potential power supply voltage and a reference voltage, the reference voltage being between the high potential power supply voltage and the low potential power supply voltage, the second voltage signal having one of the reference voltage and the low potential power supply voltage; and an output circuit connected to the input circuit for receiving the first and second voltage signals and outputting an output signal having one of the high potential power supply voltage and the low potential power supply voltage.

20. The operational amplifier according to claim 19, wherein the output circuit comprises:

a PMOS transistor and an NMOS transistor connected in series;

a first inverter circuit connected to the source of the PMOS transistor and receiving power from the high potential power supply and the reference voltage, the first inverter circuit receiving the first voltage signal and applying one of the high potential power supply voltage and the reference voltage to the source of the PMOS transistor;

a second inverter circuit connected to the source of the NMOS transistor and receiving power from the reference voltage and the low potential power supply, the second inverter circuit receiving the second voltage signal and applying one of the reference voltage and the low potential power supply voltage to the source of the NMOS transistor; and an output terminal located at a node between the PMOS transistor and the NMOS transistor for outputting an output signal.

21. The operational amplifier circuit according to claim 19, wherein the input circuit comprises:

a constant current source connected between the high potential power supply and the low potential power supply;

first and second transistors and a current mirror circuit connected in series between the constant current source and the high potential power supply, the first transistor being responsive to the first input signal and the second transistor being responsive to the reference voltage; and first and second resistors and a third transistor connected in series between the current mirror circuit and the constant current source, wherein the first voltage signal is supplied to the output circuit from a node between the current mirror circuit and the first resistor, and the second voltage signal is supplied to the output circuit from a node between the third transistor and the second resistor.

* * * * *